United States Patent
Spriggs et al.

(10) Patent No.: US 7,234,034 B2
(45) Date of Patent: Jun. 19, 2007

(54) SELF-CLOCKING MEMORY DEVICE

(75) Inventors: Stephen W. Spriggs, Rowlett, TX (US); Vikas K. Agrawal, Dallas, TX (US); Bryan D. Sheffield, Rowlett, TX (US); Eric L. Badi, Cagnes sur Mer (FR)

(73) Assignee: Texas Instruments Incorporated, Dallas, TX (US)

( * ) Notice: Subject to any disclaimer, the term of this patent is extended or adjusted under 35 U.S.C. 154(b) by 642 days.

(21) Appl. No.: 10/663,597

(22) Filed: Sep. 16, 2003

(65) Prior Publication Data

US 2004/0078510 A1    Apr. 22, 2004

Related U.S. Application Data

(60) Provisional application No. 60/411,002, filed on Sep. 16, 2002, provisional application No. 60/411,000, filed on Sep. 16, 2002, provisional application No. 60/411,207, filed on Sep. 16, 2002.

(51) Int. Cl.
    *G06F 13/00*    (2006.01)
(52) U.S. Cl. .................... 711/167; 711/105; 365/191; 365/193; 713/400
(58) Field of Classification Search .............. None
    See application file for complete search history.

(56) References Cited

U.S. PATENT DOCUMENTS 5,148,922 A * 9/1992 Marriott ................. 209/489
5,235,697 A * 8/1993 Steely et al. ............ 711/137
5,918,245 A * 6/1999 Yung ....................... 711/122
6,356,990 B1 * 3/2002 Aoki et al. .............. 711/205
6,535,045 B1   3/2003 Vangal
6,601,121 B2   7/2003 Singh et al.
6,874,077 B2 * 3/2005 Lyon ....................... 711/207
2002/0157062 A1 10/2002 Greiner

* cited by examiner

*Primary Examiner*—Hyung Sough
*Assistant Examiner*—Kaushik Patel
(74) *Attorney, Agent, or Firm*—Alan K. Stewart; W. James Brady; Frederick J. Telecky, Jr.

(57) ABSTRACT

A self-clocking memory device comprises a memory array, a memory input circuit, and a memory control circuit. The memory input circuit is operable to receive an input clock signal and generate a memory operation initiation signal in response thereto, while the memory control circuit is operable to receive the memory operation initiation signal and generate one or more control signals to initiate a memory operation in response thereto. The memory control circuit is further operable to identify completion of the memory operation and generate a cycle ready strobe signal in response thereto. The memory input circuit receives the cycle ready strobe signal as an input and generates a next memory operation initiation signal in response thereto for initiation of a next memory operation.

18 Claims, 7 Drawing Sheets

SELF-CLOCKING MEMORY DEVICE

RELATED APPLICATION

This application claims priority to Ser. No. 60/411,002, filed Sep. 16, 2002, entitled "Self clocking memory device", Ser. No. 60/411,000, filed Sep. 16, 2002, entitled "Cycle ready circuit for self clocking memory device", and Ser. No. 60/411,207, filed Sep. 16, 2002, entitled "Embedded memory (or other) function with 'cycle ready' status output signal", which are incorporated herein by reference in their entirety.

RELATED APPLICATIONS

This application is related to U.S. application Ser. No. 10/634,589 filed on Aug. 5, 2003, entitled "Self-timed Strobe Generator and Method for Use with Multi-strobe Random Access Memories to Increase Memory Bandwidth", U.S. application Ser. No. 10/663,575 filed on Sep. 16, 2003 entitled "Cycle Ready Circuit for Self-clocking Memory Device", and U.S. application Ser. No. 10/663,144 filed on Sep. 16, 2003, entitled "Method of Operating a Memory at High Speed Using a Cycle Ready Status Output Signal".

FIELD OF INVENTION

This invention relates electrical circuits, and more particularly to a system and method of self-clocking a memory device to improve a speed thereof.

BACKGROUND OF THE INVENTION

A computer system, communication device, and other devices rely on memory to store instructions and data that are processed to perform various tasks. Substantial advances have been made over the years in both the storage capacity and speed of memory devices for use in such applications, however, in some cases the speed of the memory has not kept pace with speed increases achieved with processors or other chips within the same system.

A typical memory contains an array of memory cells connected to each other by row and column lines. Each memory cell typically stores one bit of information and is accessed by a memory address that includes a row address that indexes a row of the memory array and a column address that indexes a column of the memory array. Accordingly, each memory address points to the memory cell at the intersection of the row specified by the row address and the column specified by the column address.

Many applications require a memory to be clocked at its maximum possible cycle time. However, this is extremely difficult to achieve when the maximum possible cycle time is near the system's maximum clock frequency. Such difficulty is due to additional duty cycle margin required for the clock signal as well as the clock jitter and skew margins.

Figure 1:
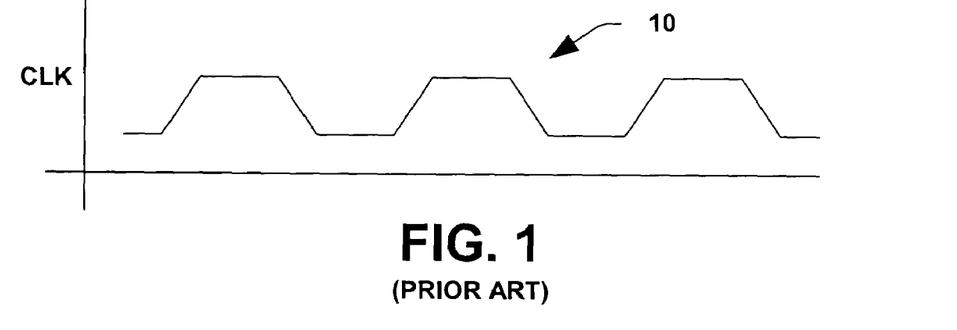
FIG. 1 is a timing diagram illustrating a conventional external clock signal for use in a memory device.
Figure 2A:
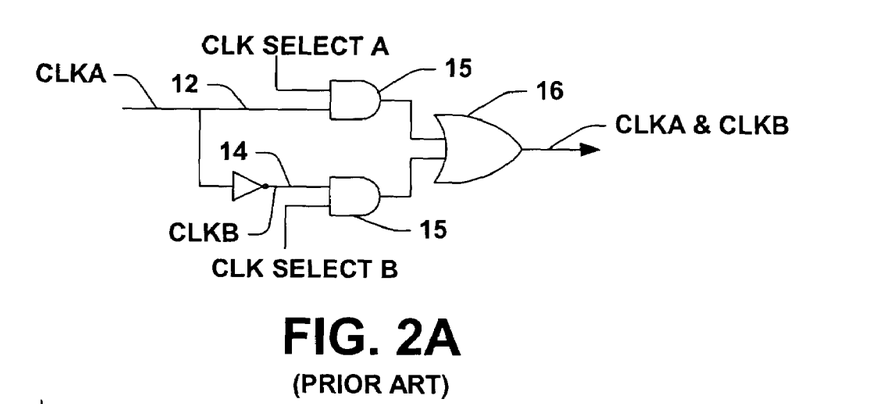
FIG. 2A is a schematic diagram illustrating conventional circuitry for generating a clock signal using a double-pumping methodology.
Figure 2B:
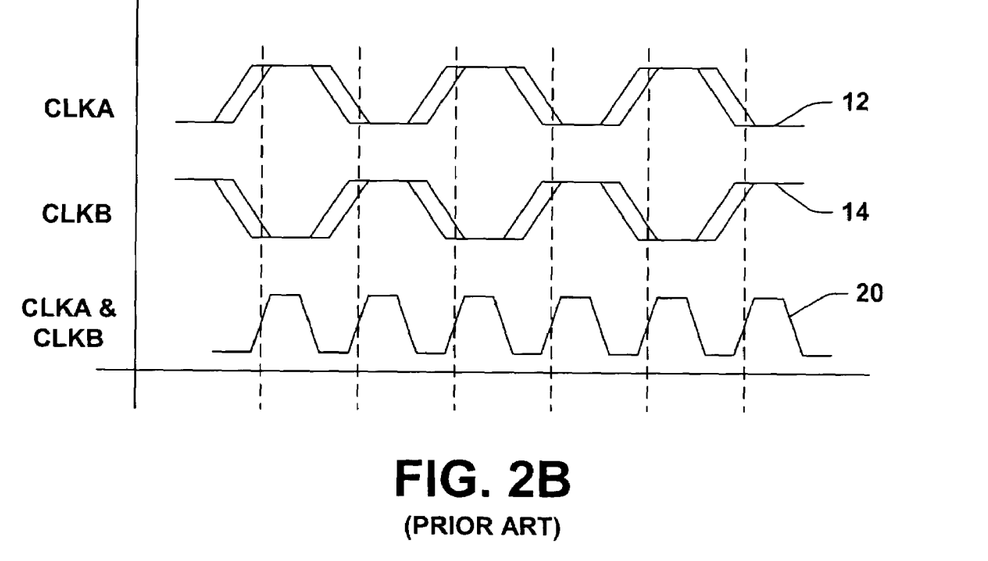
FIG. 2B is a timing diagram illustrating a resultant clock signal generated using a double-pumping circuit such as that illustrated in FIG. 2A.

A typical memory receives only a single clock input signal, as illustrated in prior art FIG. 1 and designated at reference numeral 10. Thus the memory speed was limited to the input clock signal frequency. Initially, a solution to that speed limitation was to include multiple clock inputs. This arrangement, as illustrated in one example in prior art FIG. 2A, used a first clock signal 12 (CLKA) to one clock input and a second clock signal 14 (CLKB), inverted from the first, to another clock input of the memory. This technique is often referred to as "clock pumping" or "double pumping" the clock signal, since a logic circuitry 15 and 16 along with clock select signals are employed to selectively pass the two clock signals 12 and 14. Consequently, the memory is effectively clocked at twice the system clock frequency, as illustrated in prior art FIG. 2B, and designated at reference numeral 20.

Double pumping improves the memory speed by operating at a higher frequency, however, double pumping still does not exercise the memory at its maximum possible cycle time since duty cycle margin is compounded due to the inverted clock signal. Thus, there is a need for improved memory circuit designs and solutions that facilitate improved speed.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to a memory device and associated method of increasing an operating speed of the memory. The invention improves memory speed by initiating a first memory operation based on an external system clock, and then initiating a second (next) memory operation based on an internally generated signal that is enabled when completion of the first memory operation is completed. By generating the internal signal, called in this example a cycle ready signal, when the first memory operation is complete, and using the signal for initiation of the next memory operation, the memory operates at its maximum speed, as opposed to be being operationally limited by the external clock signal timing.

In accordance with one aspect of the present invention, a self-clocking memory device is disclosed comprising a memory array and a memory control circuit. The memory control circuit is configured to initiate a first memory operation based upon an external system clock, and then initiate a second, next memory operation based upon an indication that the first memory operation is complete.

In accordance with another aspect of the present invention, the memory control circuit comprises a cycle ready circuit operable to generate a cycle ready strobe signal for initiation of the second memory operation. The cycle ready circuit identifies a transition of a bit line pre-charge enable signal associated with the memory control circuit, thereby identifying initiation of a bit line pre-charge sequence, wherein true and complement bit lines associated with a selected memory cell within the array substantially equalize and reach a predetermined voltage value. The cycle ready circuit generates the cycle ready strobe signal a predetermined period of time after initiation of the bit line pre-charge sequence to ensure that the bit lines have reached their predetermined value before the next memory operation is initiated.

In accordance with yet another aspect of the present invention, the cycle ready circuit generates the cycle ready strobe signal with timing that varies with respect to variations such as temperature, supply voltage, and process manufacturing variability. Since the timing at which the true and complement bit lines associated with a selected memory cell reach their predetermined value varies with respect to temperature, supply voltage and process conditions, the period of time that the cycle ready circuit waits to output the cycle ready strobe signal after identification of initiation of the bit line pre-charge sequence also varies in a corresponding manner. Consequently, the wait time associated with the cycle ready strobe signal does not have to represent a maximum wait based on all possible conditions (e.g., to ensure sufficient pre-charge of the bit lines), but rather the wait time dynamically varies with condition variations to maximize memory speed.

In accordance with yet another aspect of the invention, a memory control circuit including a cycle ready circuit is provided. The cycle ready circuit is operable to generate a control signal (e.g., a cycle ready strobe signal) for initiation of a second memory operation after detection of completion of a first memory operation. In one particular aspect of the invention, the control signal is operable to initiate the second memory operation a predetermined period of time after completion of the first memory operation is detected, wherein the time is sufficient to ensure that true and complement bit lines associated with a selected memory cell are substantially equalized and have reached a predetermined value.

In accordance with still another aspect of the invention, the cycle ready circuit comprises a row load circuit that provides a signal propagation delay that corresponds to a number of rows in the memory array. In the above manner, arrays that have a variable number of rows, such as compiler memories, can be accommodated, wherein the predetermined period of time can vary in accordance therewith. In another aspect of the invention, the cycle ready circuit further comprises a diode loading circuit that varies a signal propagation therethrough based on variations in memory supply voltage. Since a time it takes to precharge bit lines increases as the power supply voltage decreases, the diode loading circuit is operable to increase the signal propagation time therethrough in a similar manner, such that the timing of the control signal varies over such variations.

According to another aspect of the present invention, a method of operating a memory at high speeds is disclosed. The method comprises initiating a memory operation and, upon identifying a completion of the memory operation, generating a cycle ready strobe signal for initiating a next memory operation. In the above manner, the memory speed is not limited by an external clock signal, but instead operates at a maximum speed by initiating subsequent operations as soon as a previous operation is complete.

In another aspect of the invention, the initial memory operation is initiated with an external system clock signal used to generate one or more memory control signals such as a bit line precharge enable signal to precharge true and complement bit lines associated with a selected memory cell in the memory array to a predetermined voltage value. The memory control signals further activate a cycle ready circuit that generates the cycle ready strobe signal a predetermined period of time after the transition of the bit lone precharge enable signal, wherein the time period is sufficient to ensure that the true and complement bit lines associated with the selected memory cell substantially equalize and reach their predetermined precharge level.

In yet another aspect of the present invention, the cycle ready circuit is operable to generate the cycle ready strobe signal a predetermined period of time after detection of enablement of the bit line precharge. Since the time necessary for the true and complement bit lines associated with the selected memory is variable and a function of temperature, supply voltage and/or process variations, the predetermined time delay after which the cycle ready strobe signal is generated is also variable, and such variations are a function of temperature, supply voltage and process variation. In the above manner, a timing of the cycle ready strobe signal used to initiate the next memory operation mirrors the timing variations associated with the precharging of the bit lines. Consequently, the next memory operation is initiated as soon as possible despite variations in the time needed to properly precharge the bit lines.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

One or more implementations of the present invention will now be described with reference to the attached drawings, wherein like reference numerals are used to refer to like elements throughout. The invention relates to a memory device and a related method, wherein a memory device is operated at high speed. The memory speed is increased by employing circuitry to identify completion of a memory operation and then generate a control signal (e.g., a cycle ready strobe signal) for use in initiating a next memory operation. In the above manner, the memory speed is not limited to the speed of an external clock, but instead operates at near its maximum speed by initiating a next memory operation as soon as an initial memory operation is completed.

In order to fully appreciate various benefits associated with the present invention, a more conventional memory device operation will be discussed in conjunction with FIG.

Figure 3:
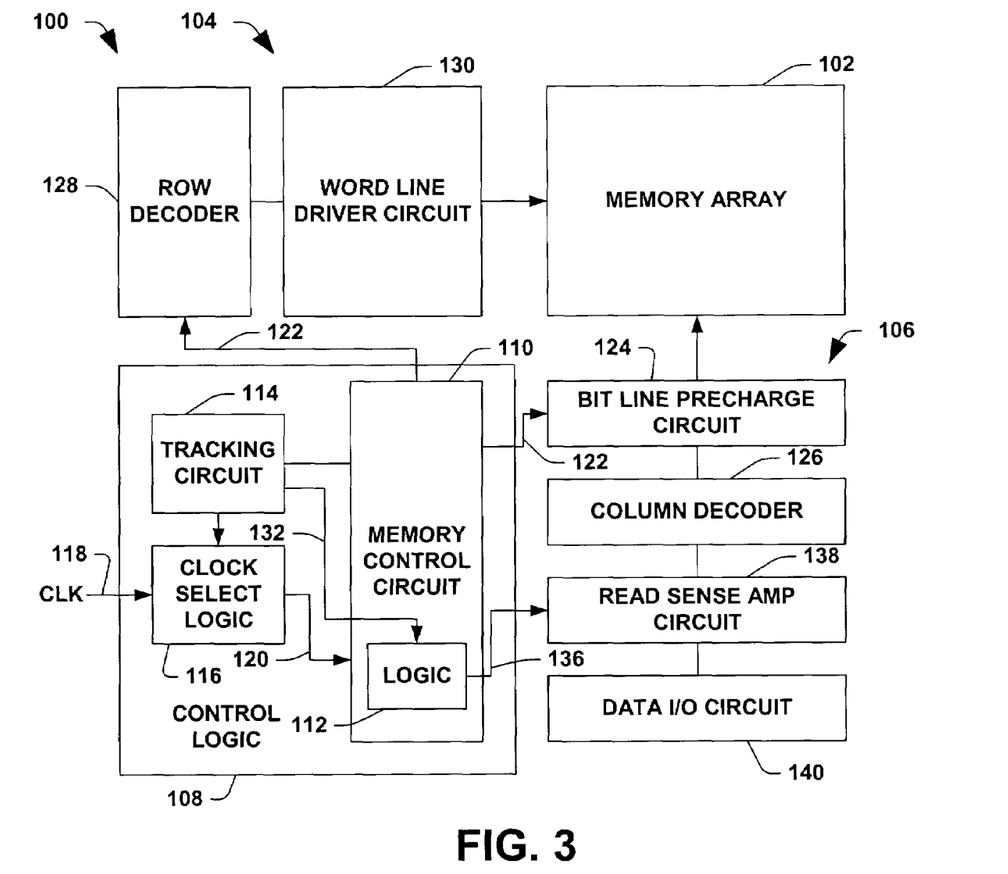
FIG. 3 is a block diagram illustrating a memory device.

3. FIG. 3 illustrates a memory device 100 composed of a memory array 102 containing a plurality of individual memory cells. The memory array 102 in the above example is organized in a plurality of rows (associated with word lines) and columns (associated with bit lines), wherein individual memory cells are addressed via word line address and control circuit 104, and bit line address and control circuit 106, respectively, under the control of memory control logic 108.

The control logic 108 includes, for example, a control circuit 110 having logic 112 associated therewith, along with a tracking circuit 114 and a clock select logic circuit 116. In operation, the clock select logic circuit 116 receives a clock signal (CLK) 118 associated with an external system clock. In systems that employ double-pumping of the clock, the input clock 118 and its inverse (not shown) are selectively employed by the clock select logic circuit 116 to generate an internal clock signal 120. The memory control circuit 110 receives the internal clock signal 120 and initiates a memory operation in response thereto.

The memory control circuit 110 generates, for example, a plurality of control signals 122 to initiate a memory operation. The control circuit 110 generates a bit line precharge disable signal to cause a bit line precharge circuit 124 to stop precharging true and complement bit lines associated with a selected memory cell within the array 102 via a column decoder 126. In addition, the control circuit 110 initiates generation of a read voltage for the selected memory cell via a row decoder 128 and a word line driver circuit 130, respectively.

The reading of data associated with the selected memory cell generates a voltage differential between the selected true and complement bit lines. The tracking circuit 114 waits a sufficient time to ensure that the differential is sufficiently established and provides a signal 132 to logic 112 within the control circuit 110 that, in turn, provides a signal 136 to activate a sense amp circuit 138. The sense amp circuitry 138 reads the contents of the selected cell by latching the data, which is then provided for use to an external device via a data I/O circuit 140.

As stated supra, the speed of the memory device 100 of FIG. 3 is dictated, at least in some respects, by the external system clock 118. For example, as illustrated in prior art FIG. 2B, even a double-pumped arrangement provides an input clock 20 that is limited by clock jitter and skew associated with the system clock. In addition, since the system clock is employed for numerous other operations, tailoring the system clock to optimize a memory operation is not practical or, in some cases, is not feasible. The inventors of the present invention appreciated that in many instances, circuitry within a memory device can operate faster than the external clock 20, 118, and that memory speed can be increased if memory operations are not driven solely by the external clock. Thus the inventors of the invention appreciated that by identifying the completion of a memory operation, and generating a control signal in response thereto for use in a next memory operation, the speed of the memory can be increased substantially.

Figure 4:
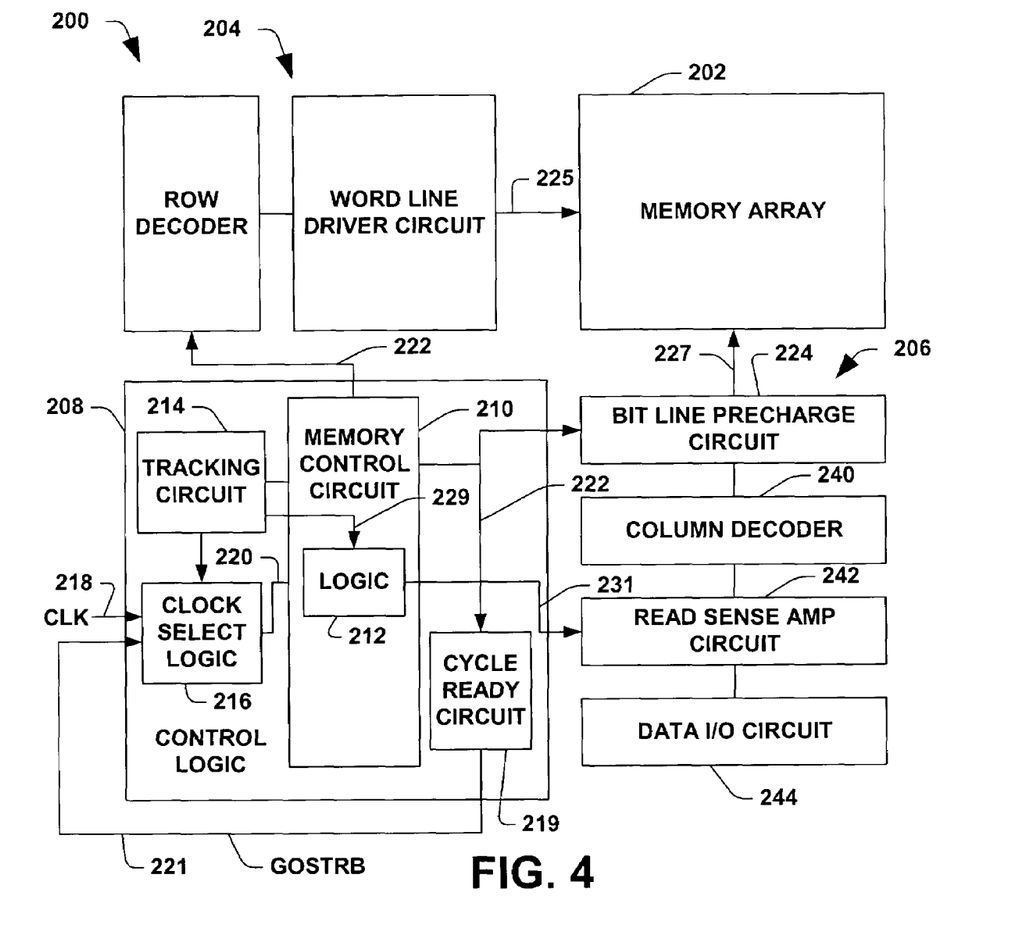
FIG. 4 is a block diagram illustrating a self-clocking type memory device in accordance with an aspect of the present invention.
Figure 5:
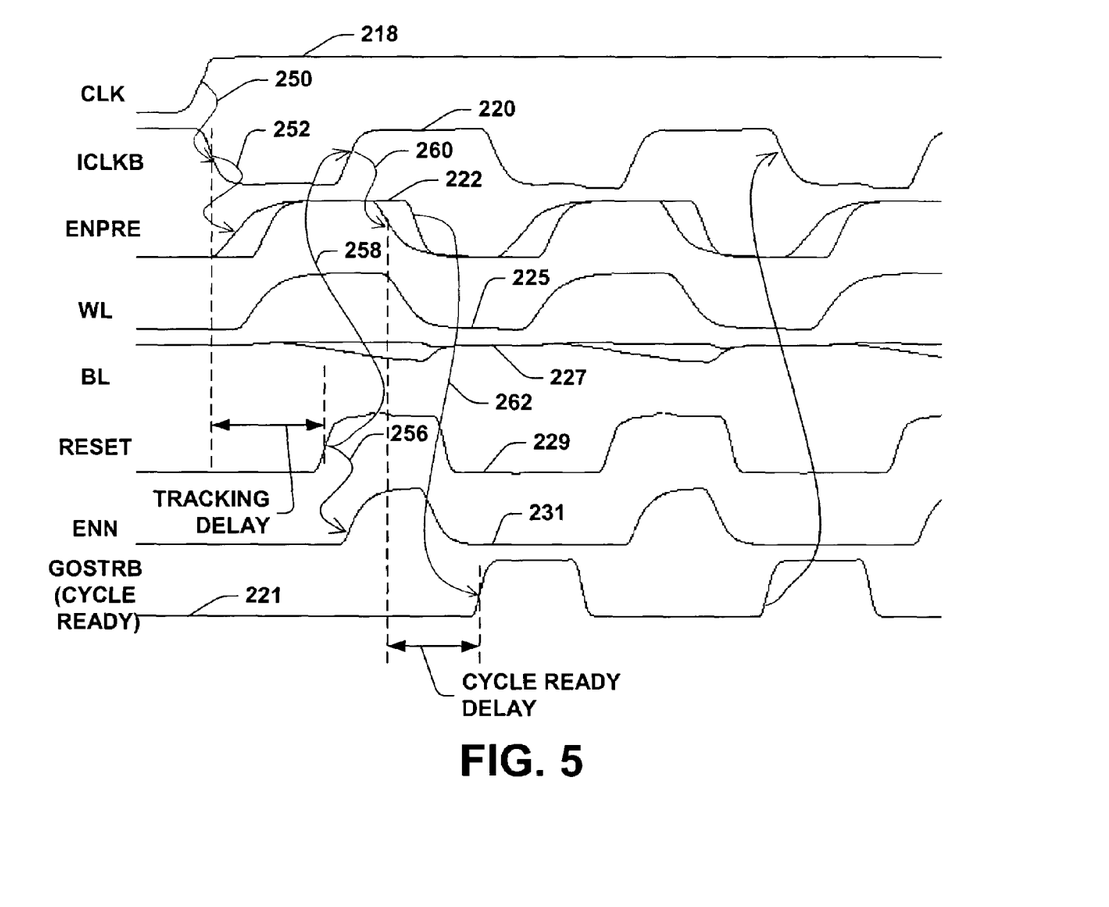
FIG. 5 is a timing diagram illustrating a plurality of differing signals generated by the self-clocking memory device of FIG. 4 according to the present invention.
Figure 6:
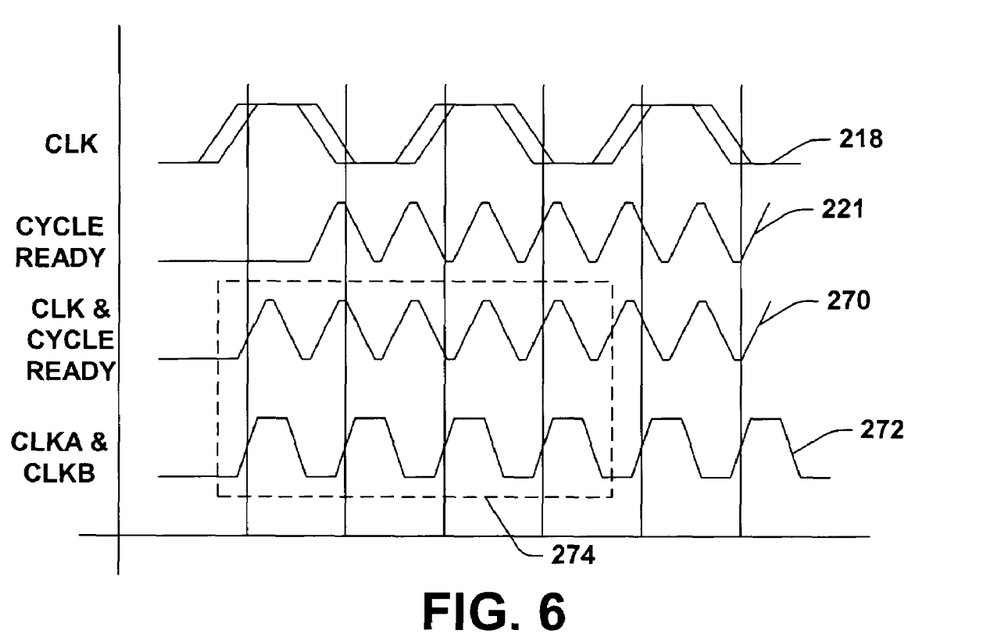
FIG. 6 is a timing diagram illustrating a plurality of clocking signals, and illustrating how the self-clocking memory device of FIG. 4 provides for improved memory speed.

Turning now to FIGS. 4-6, a memory device 200 having increased speed is provided in accordance with the present invention. The memory device includes a memory array 202 accessed and driven by row (word line) circuitry 204 and column (bit line) circuitry 206, as dictated by memory control logic 208. The memory logic 208 comprises a memory control circuit 210 containing logic 212, along with a tracking circuit 214 and a clock select logic circuit 216 that receives a signal 218 associated with an external system clock (CLK). The memory control circuit 210 further comprises a cycle ready circuit 219 operable to generate a cycle ready strobe control signal 221 (also referred to as a ghost strobe signal (GOSTRB)) in response to one or more control signals 222 from the control circuit 210.

As will be more fully appreciated below, the cycle ready circuit 219 is operable to identify completion of a memory operation by detecting an enabling of a bit line precharge circuit 224 via a control signal 222, and initiate a next memory operation thereafter via the cycle ready signal 221 (GOSTRB). The cycle ready circuit 219 feeds the cycle ready signal 221 back to the clock select logic circuit 216, and is then employed by the circuit 216 in a burst mode of operation to initiate the next memory operation.

In one example, to initiate a first memory operation, a rising edge of the external system clock (CLK) 218 is received by the clock select logic circuit 216 that triggers an internal clock signal (ICLKB) 220, for example, causing the internal clock signal 220 to go low as illustrated in FIG. 5 and designated at reference numeral 250. The internal clock signal 220 is received by the memory control circuit 210, which generates one or more control signals 222 in response thereto, wherein one such control signal comprises a bit line precharge control signal that operates to disable the bit line precharge circuit 224, as illustrated in FIG. 5 at reference numeral 252. The control signal 222 also serves to enable word line and multiplexer select signals for addressing a select memory cell within the array 202 via circuit 204 and 240.

The memory control circuit 210 also enables the tracking circuit 214 in response to the internal clock signal 220. The tracking circuit 214 acts as a timer circuit and waits a predetermined period of time (call, for example, a tracking delay) prior to generating a reset signal 229 to logic 212, as illustrated in FIG. 5. The tracking delay allows time for a voltage differential to develop between the true and complement bit lines 227 associated with the select memory cell within the memory array 202. The reset signal 229 triggers generation of a sense amp enable signal (ENN) 231, as illustrated in FIG. 5 at reference numeral 256. When the sense amp enable signal 231 transitions, the sense amp circuit 242 is activated and the voltage differential on the true and complement bit lines is sensed and latched, and then transferred to the data I/O circuit 244.

In addition to the above operation, the reset signal 229 causes the internal clock signal 220 to transition via the clock select logic circuit 216, as illustrated in FIG. 5 at reference numeral 258. The transition in the internal clock signal 220 causes the memory control circuit 210 to enable the bit line precharge circuit 224 via the control signal (ENPRE) 222 at reference numeral 260. The enabling of the bit line precharge signal effectively indicates that the memory operation is complete. Thus, in order to maximize the speed of the memory device 200, the present invention initiates the next memory operation as soon as possible independently of the state of the external clock. The next memory operation will be initiated by the cycle ready signal (GOSTRB) 221, however, as will be further appreciated below, the cycle ready signal 221 will not be activated until a predetermined period of time has elapsed after the bit line precharge signal 222 is enabled.

The control signal 222 (that enables the bit line precharge circuit 224) is also provided to the cycle ready circuit 219, thereby activating the circuit. According to the present invention, the cycle ready circuit 219 waits a predetermined period of time after the transition of ENPRE 222 to ensure that the true and complement bit lines associated with the selected memory cell in the memory array 202 have substantially equalized and reached a predetermined value. In one exemplary aspect of the present invention, the predetermined value may be a high logic value (e.g., VDD); alternatively, the value may differ (e.g., VDD/2). Any predetermined value may be employed in the above invention, and such variations contemplated thereby.

Once the predetermined period of time (labeled as the cycle ready delay in FIG. 5) has elapsed (see 262 in FIG. 5), the bit lines are sufficiently precharged, and the cycle ready signal 221 transitions, and is received by the clock select logic circuit 216. In one example, when the memory control circuit 210 indicates to the clock select logic circuit 216 that the memory 200 is in a "burst mode", the clock select logic circuit 216 triggers the internal clock signal 220 in response to the cycle ready signal 221. In the above manner, the memory device 200 initiates a next memory operation as soon as the memory is capable of performing the next operation independent of the state of the external clock (CLK) 218. Consequently, the speed of the memory 200 is maximized, and is not limited to the system clock speed that may transition at a rate dictated by other system constraints.

For example, as illustrated in FIG. 6, an external clock (CLK) 218 transitions at a given rate and exhibits an amount of jitter and/or skew associated therewith. The cycle ready signal 221 is also illustrated in FIG. 6. Note that the cycle ready signal 221 does not transition until after a first memory operation (triggered by the external system clock 218) has occurred. Thus, the memory device 200 of FIG. 5 operates at a rate dictated by both the external clock 218 and the cycle ready signal 221 (as employed collectively by the clock select logic circuit 216 in the burst mode), as illustrated by the signal 270 in FIG. 6. The memory speed rate is thus dictated by the signal 270, in contrast to a conventional double-pumped architecture, as illustrated in FIG. 6 by the signal 272. Thus, as can be seen in FIG. 6, within a time period 274, the memory device 200 of the present invention can perform five (5) memory operations in the burst mode compared to the double-pumped type device that can perform only four (4) memory operations within the same time period 274. Thus the memory device of the present invention provides for a significant increase in speed.

Although in the above example the cycle ready signal could be interpreted as a chip that exits a chip and externally couples to a chip input pin, alternatively the signal can be internal and still fall within the scope of the present invention. With the external example, it should be further understood that a user can use the cycle ready signal with additional multiplexer or logic control circuitry to control the number of cycles in which the signal is active (e.g., a selectable burst mode). These and other variations associated with the present invention can be employed and are contemplated as falling within the scope of the present invention.

From the above, it can be appreciated that the present invention advantageously improves memory speed by initiating a next operation immediately after a first or initial memory operation is identified as being completed. More particularly, once data is read (the voltage differential on the bit lines sense) and latched, the bit line precharge procedure is initiated for the next memory operation. The cycle ready circuit 219 is initiated or activated at the same time, and is operable to generate the cycle ready signal 221 for the next memory operation a predetermined period of time after activation. The predetermined period of time is sufficient to ensure that the true and complement bit lines have substantially equalized and reached a predetermined level, that is, to ensure that the bit line precharge procedure is substantially complete.

It was further appreciated by the inventors of the present invention that the amount of time needed to substantially complete the bit line precharge sequence is not constant, but rather varies based upon various conditions, for example, number of rows in the memory array and supply voltage. The cycle ready circuit, according to one aspect of the present invention, advantageously varies the predetermined period of time to generate the cycle ready signal to correspond substantially with variations in the time needed to complete the bit line precharge sequence. In the above manner, initiation of the next memory operation can be initiated as quickly as possible across such variations rather than having to wait a fixed period of time corresponding to the longest possible bit line precharge time.

Figure 7:
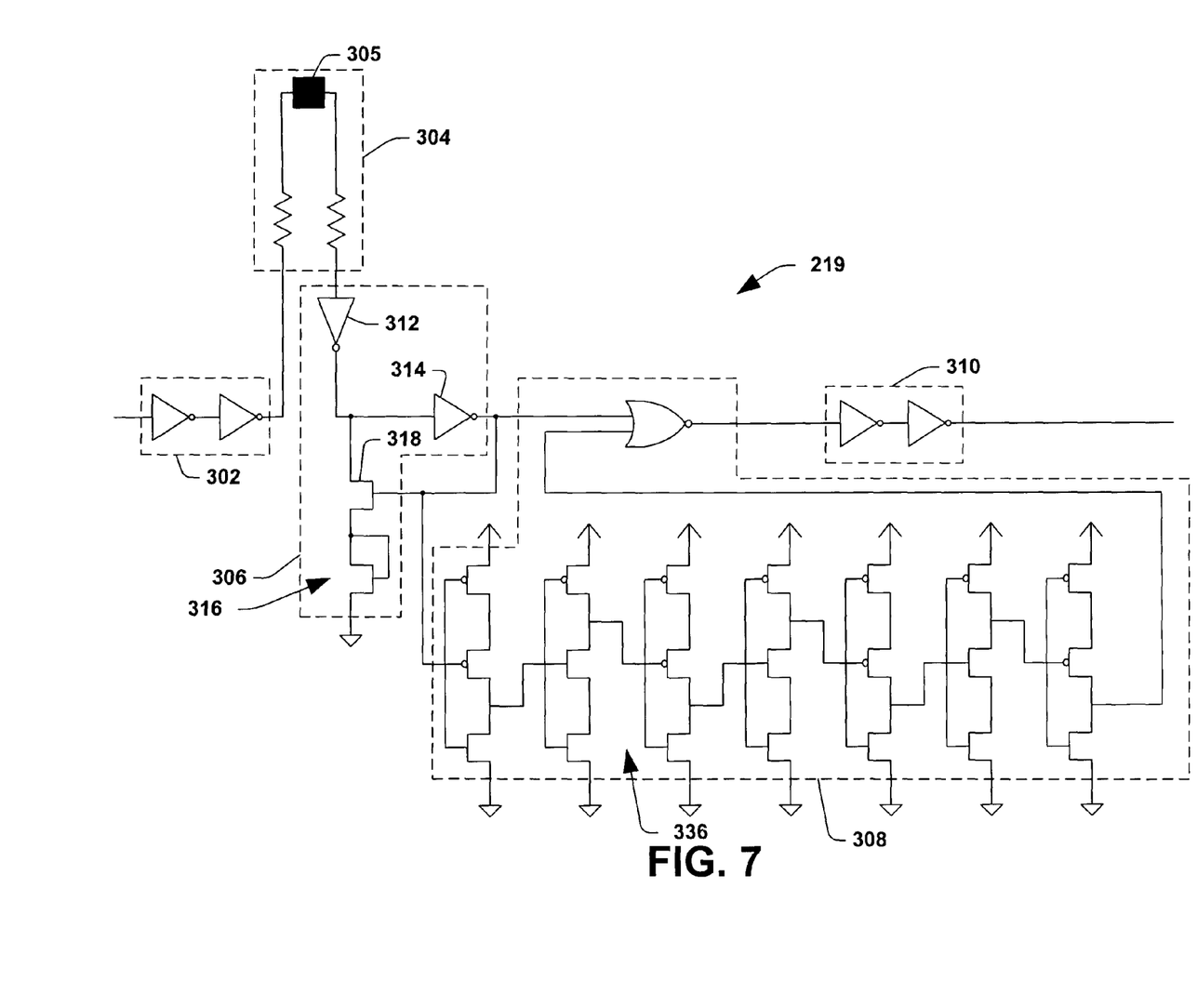
FIG. 7 is a schematic diagram illustrating details of a cycle ready circuit of FIG. 4 according to an exemplary aspect of the present invention.

Turning to FIG. 7, a schematic diagram of the cycle ready circuit 219 is illustrated according to one exemplary aspect of the present invention. The circuit 219 includes an input buffer circuit 302, a row loading circuit 304, a diode loading circuit 306, a pulse generator circuit 308, and an output buffer circuit 310. The input and output buffer circuits 302 and 310 provide input and output signal conditioning, respectively, and also provide a relatively fixed amount of delay associated with signal propagation therethrough.

The row loading circuit 304 generally mimics the amount of load seen by the actual bit lines, and thus allows the cycle ready circuit to substantially track the amount of time needed to precharge the actual bit lines. In one example, the row loading circuit 304 comprises a dummy bit line having a loading corresponding to the actual bit lines (e.g., the number of rows associated with the actual bit lines in the array), and such dummy bit line may, but does not require, dummy bit cell transistor or other loading elements coupled thereto. In addition, the row loading circuit 304 may include a tuning element 305 that effectively provides fine-tuning of the length of the circuit 304. For example, the tuning element 305 may comprise an array of poly fuses or other type programmable elements that can be programmed to vary the length associated with the row loading circuit 304 to make fine tuned adjustments for any needed timing margin accommodations. Although the row loading circuit 304 is illustrated as a collective resistance, capacitance and other loading variables associated with the actual bit lines such that variations in the loading experienced by the actual bit lines are substantially reproduced within the row loading circuit 304.

The diode loading circuit 306, in one example, comprises a buffer having two series-connected inverters 312 and 314 with a diode-connected transistor 316 loaded in a feedback path associated with the second inverter 314 through a transistor 318. In operation, when the input to the circuit 306 is high (the bit line precharge operation is not enabled or active), the output of the second inverter 314 is high and the transistor 318 in the feedback path is on, thus coupling the diode load 316 to the input of the second inverter 314. When the bit line precharge sequence is initiated (ENPRE goes low), the first inverter wants to go high, but since the transistor 318 is on, the diode load tends to slow down the output transition of the first inverter 312. Consequently, the diode load 316 within the circuit 306 serves to delay the propagation of the signal therethrough.

The diode loading circuit 306 advantageously provides a variable time delay (signal propagation therethrough) that substantially tracks variations in bit line precharge due to variations in supply voltage. As supply voltage decreases, the bit line precharge time increases due to a reduced effective strength of P-channel MOS pull-up transistors employed within the bit line precharge circuit 224. The diode loading circuit 306 advantageously mimics this variation. At low supply voltages, the diode 316 is effectively off due to a lack of voltage headroom and plays substantially no role in the circuit operation. At high supply voltages, the inverters would otherwise switch too quickly, but the diode load 316 at higher supply voltages is activated in the feedback path and operates to slow the rate at which the second inverter 314 switches. More particularly, at higher supply voltages, the output of the first inverter 312 has more strength and would otherwise switch the second inverter quite quickly, however, at the higher supply voltage the diode load 316 is a heavier loading on the output, thus causing the output to slow down. Nevertheless, the rate at which the output of the first inventor goes high decreases, which causes the signal propagation through the diode loading circuit to increase in a manner corresponding to an increase in the bit line precharge time.

The pulse generator circuit 308 of FIG. 7 generates the cycle ready signal (GOSTRB) 221 with a pulse width that is a function of an internal pulse generator delay. The pulse generator circuit 308 comprises a NOR gate 330 having a first input 332 from the diode load circuit 306 and a second input from an inverting delay path 336. At steady state, when the first input 332 is high, the second input 334 is low; thus the output of the NOR gate 330 is low. When ENPRE goes low (to initialize the bit line precharge sequence), the first input 332 goes low. For a period of time corresponding to signal propagation through the inverting delay path 336, the second input 334 is still low, causing the NOR gate output to go high. After the delay time period has expired, however, the second input 334 goes high forming the NOR gate output to return to a low level. Thus the delay path timing in path 336 dictates a pulse width of the cycle ready signal (the buffered output of the NOR gate 330). Further, the pulse (the cycle ready strobe (GOSTRB)) will only be generated when ENPRE goes low (i.e., the bit line precharge sequence is initiated).

As can be seen from the discussion above, the cycle ready circuit 219 generates a cycle ready signal a predetermined period of time after the bit line precharge sequence is enabled, and the cycle ready signal timing varies in a manner that corresponds with variations in bit line loading and supply voltage. In the above manner, the next memory operation is initiated as quickly as possible, thereby improving memory speed.

In accordance with another aspect of the present invention, a method of operating a memory at a maximum speed is disclosed below in conjunction with FIG. 8, and designated at reference numeral 400. While the exemplary method 400 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the formation and/or processing of structures illustrated and described herein as well as in association with other structures and devices not illustrated.

Figure 8:
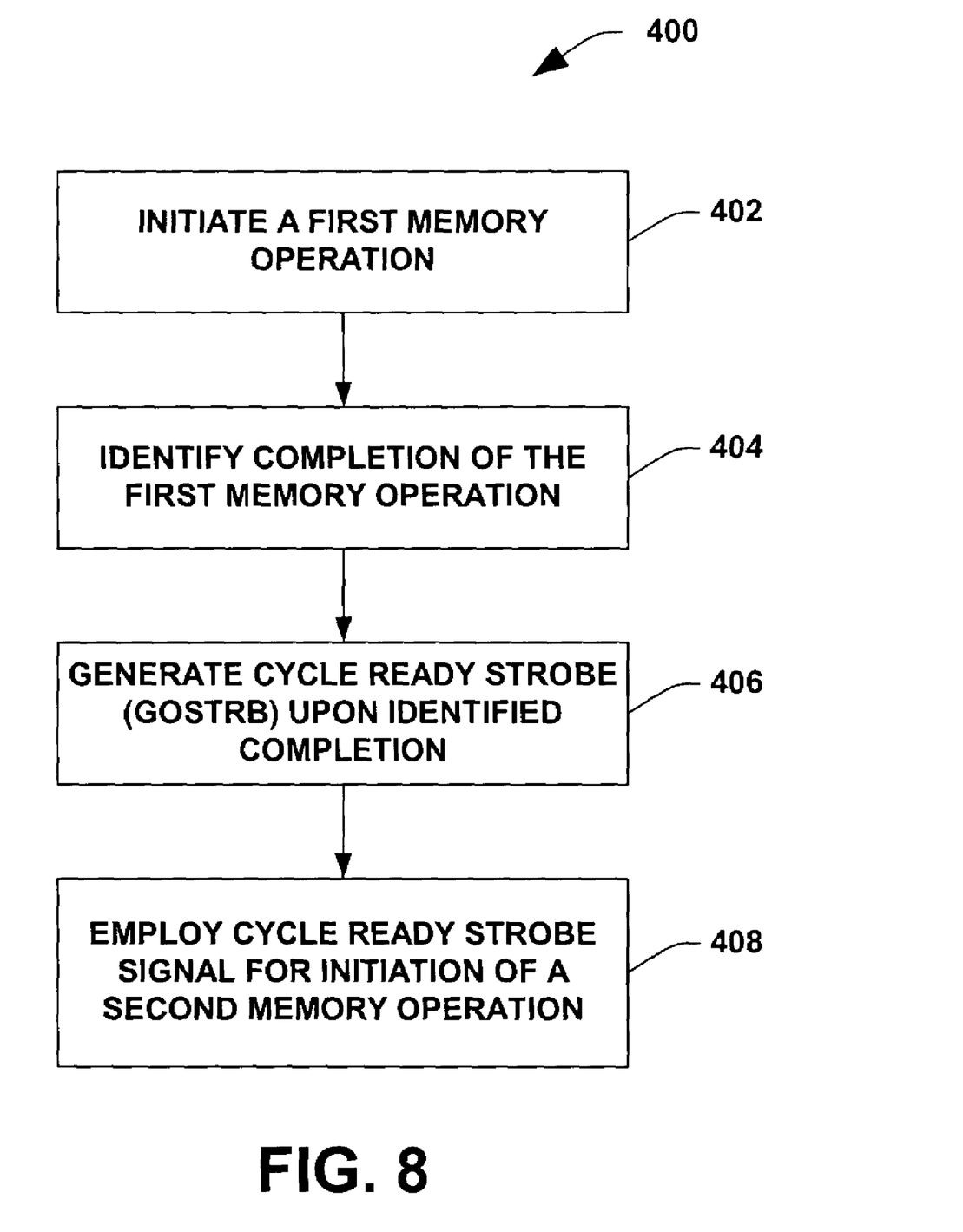
FIG. 8 is a flow chart illustrating a method of operating a memory at high speed according to another aspect of the present invention.

The method 400 begins at 402 in FIG. 8, wherein a first memory operation is initiated. For example, as described supra, the first memory operation may be initiated by an input signal to the memory device that corresponds to an external system clock. The input signal, for example, is then utilized to generate one or more memory control signals for use in executing the memory operation. The method 400 continues at 404 by identifying a completion of the first memory operation. For example, the completion of the memory operation may be identified by detecting an initiation of a bit line precharge sequence.

Still referring to FIG. 8, the method 400 continues with generating a cycle ready strobe (GOSTRB) signal upon identifying the completion of the first memory operation at 406. For example, if the initiation of the bit line precharge sequence is used as an indication of completion of the memory operation, the cycle ready signal may trigger based on the bit line precharge enable signal.

In one exemplary aspect of the present invention, the cycle ready signal is generated a predetermined period of time after the bit line precharge enable signal is detected, and the predetermined period of time is sufficient to ensure that the true and complement bit lines associated with the selected memory cell have substantially equalized and reached a predetermined value. Further, in another exemplary aspect of the invention, the predetermined period of time after which the cycle ready signal is generated is a function of memory loading (e.g., number of rows in the array) and/or of supply voltage. In the above manner, the timing in which the cycle ready signal is generated will mirror variations in the time needed for the bit line precharge sequence to substantially or sufficiently complete. Therefore it is known that the next memory operation can be initiated, and such initiation is effectuated as quickly as possible.

The method 400 continues at 408, wherein the cycle ready strobe (GOSTRB) signal is employed to initiate a second, subsequent memory operation. Since the cycle ready strobe signal is used for the next operation, and the cycle ready signal does not correspond to the external clock, but instead is triggered by the completion of the first operation, the second operation is triggered as soon as possible, thereby improving the memory speed.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A self-clocking memory device, comprising:
   a memory array;

a memory input circuit operable to receive an input clock signal and generate a memory operation initiation signal in response thereto;

a memory control circuit operable to receive the memory operation initiation signal and generate one or more control signals to initiate a memory operation in response thereto, the memory control circuit further operable to identify completion of the memory operation and generate a cycle ready strobe signal in response thereto, wherein the memory input circuit receives the cycle ready strobe signal as an input and generates a next memory operation initiation signal in response thereto for initiation of a next memory operation; and a tracking circuit operable to generate a reset signal a predetermined period of time after generation of the memory operation initiation signal, wherein the reset signal is operable to disable the memory operation initiation signal.

2. The self-clocking memory device of claim 1, further comprising a bit line precharge circuit operable to precharge one or more bit lines of the memory array to a predetermined potential after a memory operation is completed in response to enabling a bit line precharge signal as one of the one or more control signals of the memory control circuit.

3. The self-clocking memory device of claim 2, wherein the memory control circuit further comprises a cycle ready circuit operable to generate the cycle ready strobe signal in response to the enabling of the bit line precharge signal.

4. The self-clocking memory device of claim 3, wherein the memory operation initiation signal comprises an internal memory clock signal operable to disable the bit line precharge signal upon a transition thereof, thereby signaling an initiation of the memory operation.

5. The self-clocking memory device of claim 3, wherein the cycle ready circuit is further operable to generate the cycle ready strobe signal a predetermined period of time after the enabling of the bit line precharge signal.

6. The self-clocking memory device of claim 5, wherein the predetermined period of time is sufficient to ensure that the true and complement bit lines associated with a selected memory cell within the memory array are equalized and have reached a predetermined voltage level.

7. The self-clocking memory device of claim 1, wherein the predetermined period of time is sufficient to ensure the true and complement bit lines associated with a selected memory cell in the memory array establish a voltage differential based on a state of the selected memory cell.

8. The self-clocking memory device of claim 1, wherein the tracking circuit employs column or row address loading associated with the memory array to generate a delay substantially equal to the predetermined period of time.

9. A memory device, comprising:
a memory array;
a memory control circuit operable to initiate a first memory operation based on an external system clock, and initiate a second memory operation based on an indication that the first memory operation is completes;
wherein the memory control circuit is operable to detect completion of the first memory operation and generate a cycle ready signal for initiation of the second memory operation; and
wherein the memory control circuit comprises an input multiplexer logic circuit operable to select one of a signal associated with the external system clock and the cycle ready signal and generate an internal clock signal in response thereto based on whether the memory device is in a burst mode of operation.

10. The memory device of claim 9, wherein the memory control circuit is operable to generate the cycle ready signal a predetermined period of time after a bit line precharge signal is enabled, wherein the predetermined period of time is sufficient to ensure that true and complement bit lines associated with a selected memory cell equalize and reach a predetermined value.

11. The memory device of claim 10, wherein a time period in which the true and complement bit lines associated with the selected memory cell substantially equalize and reach a predetermined value and wherein the time period is a function of temperature, supply voltage or process variation, and wherein the memory control circuit is operable to vary the predetermined period of time associated with the generation of the cycle ready signal in accordance with variations in the time period for bit line equalization.

12. The memory device of claim 9, further comprising a bit line precharge circuit associated with the memory array, and operable to precharge true and complement bit lines associated with a selected memory cell in the memory array, and wherein the memory control circuit is operable to enable a bit line precharge signal to initiate a precharge of the true and complement bit lines via the bit line precharge circuit in response to the generated internal clock signal.

13. The memory device of claim 12, wherein the memory control circuit is further operable to disable the bit line precharge circuit based on another state of the internal clock signal.

14. The memory device of claim 13, wherein the memory control circuit further comprises a tracking circuit operable to generate a reset control signal a predetermined period of time after the internal clock signal disables the bit line precharge circuit, wherein the predetermined period of time is sufficient for the true and complement bit lines associated with the selected memory cell to establish a voltage differential therebetween based on a state of the selected memory cell.

15. The memory device of claim 14, further comprising a sense amp circuit associated with the memory array, wherein the tracking circuit is operable to generate a sense amp enable signal after generating the reset signal, thereby latching data associated with the selected memory cell via the sense amp circuit.

16. The memory device of claim 14, wherein the reset signal transitions the internal clock signal, thereby enabling the bit line precharge circuit for a next memory operation.

17. The memory device of claim 14, wherein the memory control circuit further comprises a cycle ready circuit operable to generate the cycle ready signal for initiation of the second memory operation based upon a transition of the bit line precharge signal indicating initiation of a precharge of true and complement bit lines associated with a selected memory cell within the memory array.

18. The memory device of claim 17, wherein the cycle ready circuit is operable to generate the cycle ready signal a predetermined period of time after the bit line precharge signal is enabled, wherein the predetermined period of time is sufficient to ensure that true and complement bit lines associated with a selected memory cell substantially equalize and reach a predetermined value.

* * * * *